(12) United States Patent
Mizuno et al.

(10) Patent No.: US 7,760,475 B2
(45) Date of Patent: Jul. 20, 2010

(54) MAGNETO-RESISTANCE EFFECT ELEMENT HAVING FREE LAYER INCLUDING MAGNETOSTRICTION REDUCTION LAYER AND THIN-FILM MAGNETIC HEAD

(75) Inventors: Tomohito Mizuno, Tokyo (JP); Yoshihiro Tsuchiya, Tokyo (JP); Kei Hirata, Tokyo (JP)

(73) Assignee: TDK Corporation, Tokyo (JP)

( * ) Notice: Subject to any disclaimer, the term of this patent is extended or adjusted under 35 U.S.C. 154(b) by 635 days.

(21) Appl. No.: 11/685,043

(22) Filed: Mar. 12, 2007

(65) Prior Publication Data
US 2008/0226947 A1 Sep. 18, 2008

(51) Int. Cl.
G11B 5/127 (2006.01)
(52) U.S. Cl. ............................. 360/324.12; 360/324
(58) Field of Classification Search ............. 360/324.12
See application file for complete search history.

(56) References Cited

U.S. PATENT DOCUMENTS

| 6,338,899 B1 * | 1/2002 | Fukuzawa et al. | ...... 360/324.12 |
| 6,665,155 B2 * | 12/2003 | Gill | ...... 360/324.12 |
| 2003/0137785 A1 * | 7/2003 | Saito | ...... 360/324.11 |
| 2005/0074634 A1 | 4/2005 | Hasegawa et al. | |
| 2006/0114716 A1 * | 6/2006 | Kai et al. | ...... 365/158 |
| 2006/0203398 A1 | 9/2006 | Ishizone et al. | |
| 2006/0262460 A1 * | 11/2006 | Ide et al. | ...... 360/324.12 |
| 2007/0139827 A1 * | 6/2007 | Gao et al. | ...... 360/324.2 |

FOREIGN PATENT DOCUMENTS

| JP | 2003-218428 A | 7/2003 |
| JP | 2005-116701 | 4/2005 |
| JP | 2006-5282 A | 1/2006 |
| JP | 2006-253451 | 9/2006 |

OTHER PUBLICATIONS

An Office Action dated Mar. 25, 2009 against the Japanese counterpart of the present application and a partial English translation of the Examiner's comments.

* cited by examiner

Primary Examiner—William J Klimowicz
Assistant Examiner—Carlos E Garcia
(74) Attorney, Agent, or Firm—Knobbe Martens Olson & Bear LLP

(57) ABSTRACT

A magnetoresistance effect element includes a pinned layer having a fixed magnetization direction, a free layer having a magnetization direction variable depending on an external magnetic field, and a nonmagnetic spacer layer disposed between the pinned layer and the free layer. The free layer includes a Heusler alloy layer and a magnetostriction reduction layer made of a 4th group element, a 5th group element, or a 6th group element.

9 Claims, 7 Drawing Sheets

MAGNETO-RESISTANCE EFFECT ELEMENT HAVING FREE LAYER INCLUDING MAGNETOSTRICTION REDUCTION LAYER AND THIN-FILM MAGNETIC HEAD

BACKGROUND OF THE INVENTION

1. Field of the Invention

The present invention relates to a magneto-resistance effect element and a thin-film magnetic head.

2. Description of the Related Art

Magnetic disk drives employ a thin-film magnetic head having a magneto-resistance effect element (MR element) for reading magnetic signals. In recent years, efforts have been made to design magnetic disk drives for higher recording densities, and accordingly there are growing demands for thin-film magnetic heads, particularly magneto-resistance effect elements, which satisfy higher-sensitivity and higher-output requirements.

A CIP-GMR (Current in Plane-Giant Magneto-resistance) element which is a giant magneto-resistance effect element having a nonmagnetic layer between ferromagnetic layers and passing a sensing current in parallel to a layer surface, has been conventionally developed as a reproducing element in a thin-film magnetic head. On the other hand, a magnetic head that uses a TMR (Tunnel Magneto-resistance) element which has an insulation layer instead of the nonmagnetic layer as an intermediate layer and which passes a sensing current perpendicular to a layer surface, has also been developed in order to achieve higher densification. Furthermore, a magnetic head that uses a CPP (Current Perpendicular to Plane)-GMR element which is a GMR element having a nonmagnetic layer as the intermediate layer and passing a sensing current perpendicular to the layer surface similar to the TMR element, has also been developed. CPP-GMR element has an advantage of having low resistance in comparison with the TMR element and having higher output in a narrower track width than the CIP-GMR element.

An ordinary GMR element is in the cylindrical shape of a desired size, and has a structure interposing a non-magnetic spacer layer between a pinned layer which is a ferromagnetic layer in which the magnetization direction is fixed a and a free layer which is a ferromagnetic layer in which the magnetization direction varies according to an external magnetic field. Such a GMR element is also referred to as a spin valve film (SV film). The upper and lower ends of the GMR element are provided with a cap layer and a buffer layer, respectively. The cap layer, the GMR element, and the buffer layer are interposed between the upper shield layer and the lower shield layer. In the case of the CPP-GMR element, the upper shield layer and the lower shield layer function as an electrode, respectively, and a sense current flows in a direction orthogonal to the layer surface.

Heretofore, most of the layers that make up a CPP-GMR element are made of a CoFe alloy or a NiFe alloy. If such a CPP-GMR element has a practical read gap of about 40 nm, then the MR ratio of the CPP-GMR element is of a low value of about 4%.

Japanese Patent Laid-Open No. 2003-2418428 discloses that a CPP-GMR element having a high MR ratio of 10% or higher is obtained if a free layer and a pinned layer are made of a Heusler alloy. Specifically, it is known that the higher the MR ratio the-greater is the spin polarizability of the free and pinned layers, and the MR ratio increases if the free and pinned layers are made of a material having a high spin polarizability. It is also known that the material for realizing a half metal which is a magnetic material having spin polarizability of 100% or nearly 100% is a Heusler alloy. If Heusler alloy layers are thus used in the free and pinned layers, then the MR ratio increases for an increased output.

Japanese Patent Laid-Open No. 2006-5282 discloses a CPP-GMR having a pinned layer which includes a plurality of magnetic layers, some of which are made of a Heusler alloy.

As disclosed in the above patent documents, if the free and pinned layers of a CPP-GMR element contain a Heusler alloy typified by CoMnSi and CoMnGe, then it is possible to improve MR ratio.

However, if a Heusler alloy is to exhibit a high spin polarizability, then the Heusler alloy has generally to be annealed at a high temperature. For example, CoMnSi which is a typical Heusler alloy, exhibits a high spin polarizability when it has been annealed at a temperature of 300° C. or higher. However, it is not preferable for the process for fabricating CPP-GMR elements to include steps at a temperature of 300° C. or higher, and all the steps of the process of fabricating CPP-GMR elements should be carried out at a temperature of 290° C. or lower. This is because, if an MR element is subjected to a temperature of 300° C. or higher, Permalloy (NiFe) of the shield layer undergoes grain growth, resulting in a reduction of magnetic permeability.

On the other hand, another typical Heusler alloy, CoMnGe, exhibits a high spin polarizability even when it has been annealed at temperatures ranging from 270° C. to 290° C. Therefore, CoMnGe is practically preferable over CoMnSi as a Heusler alloy for use in the free and pinned layers of a CPP-GMR element.

However, CoMnGe has a very large magnetostriction in a regularized state. While the magnetostriction of 90Co10Fe and 80Ni20Fe as measured by the optical lever method is represented by about $\pm 3 \times 10^{-6}$, the magnetostriction of regularized CoMnGe as measured by the optical lever method is represented by about $\pm 1 \times 10^{-5}$.

The pinned layer whose magnetization direction is fixed by an exchange coupling with the antiferromagnetc layer poses no problem even if it has a certain high level of magnetostriction. However, if the free layer whose magnetization direction is variable, depending on the external magnetic field, has a high level of magnetostriction, then the waveform symmetry is undesirably lowered. Therefore, a high level of magnetostriction of the free layer is not preferable.

The waveform symmetry refers to an accurate proportionality relationship from the point of origin, between the external magnetic field due to the recording medium or the like and the output voltage of the MR element, as shown in FIG. 1. Specifically, the waveform symmetry represents, when the external magnetic field is 0 A/m, the output voltage is 0 mV, when a positive magnetic field is applied, a positive output voltage is produced, and when a negative magnetic field is applied, a negative output voltage is produced. Usually, the waveform symmetry is expressed as a percentage of asymmetry. It is empirically known that asymmetry of an MR element is optimum if it is 0% (as indicated by the solid-line curve in FIG. 1) and is allowable in a range of ±10% (as indicated by the broken-line curves in FIG. 1). However, if the asymmetry of an MR element is large (as indicated by the two-dot-and-dash-line curves in FIG. 1), then a thin-film magnetic head incorporating the MR element fails to provide a desired reading performance. The relationship between the magnetostriction of the free layer and the waveform symmetry as shown in FIG. 2 indicates that the waveform symmetry is in an allowable range if the magnetostriction of the free layer is represented by about $6.5 \times 10^{-6}$ or lower. Therefore, it is necessary that the magnetostriction of the free layer be kept at the level of $6.5 \times 10^{-6}$ or lower. As described above, regularized CoMnGe fails to satisfy the requirement, though 90Co10Fe and 80Ni20Fe satisfies the requirement. It has thus been practically difficult to employ a CoMnGe film in the free layer.

SUMMARY OF THE INVENTION

It is an object of the present invention to provide a magnetoresistance effect element and a thin-film magnetic head in which a Heusler alloy layer, which exhibits a high spin polarizability even if it is annealed at a relatively low temperature, can be employed in a free layer and therefore a high MR ratio can be achieved by a reduction of the magnetostriction of the Heusler alloy layer.

A magnetoresistance effect element according to the present invention includes a pinned layer having a fixed magnetization direction, a free layer having a magnetization direction variable depending on an external magnetic field, and a nonmagnetic spacer layer disposed between the pinned layer and the free layer, the free layer including a Heusler alloy layer and a magnetostriction reduction layer made of a 4th group element, a 5th group element, or a 6th group element.

With the above arrangement, since the magnetostriction of the free layer is reduced by the magnetostriction reduction layer, the characteristics such as waveform symmetry, etc., are prevented from being lowered. As a result, the Heusler alloy layer can be incorporated in the free layer, contributing to an increase in the MR ratio of the magnetoresistance effect element.

The free layer further includes a magnetic layer of CoFe.

The Heusler alloy layer comprises a CoMnGe film. This arrangement has heretofore been difficult to employ in the free layer, but is made possible for the first time according to the present invention.

The magnetostriction reduction layer should preferably comprise an Hf film, a Ti film, a Zr film, a Ta film, or a W film. If the magnetostriction reduction layer has a thickness ranging from 0.2 nm to 1.0 nm, then MR ratio which is higher than heretofore can be achieved.

The magnetoresistance effect element should preferably has been annealed at a temperature of 290° C. or lower. In this case, the characteristics of a thin-film magnetic head are prevented from being degraded by heat, and the annealing facility and the annealing process are simplified.

The above and other objects, features, and advantages of the present invention will become apparent from the following description with reference to the accompanying drawings which illustrate an embodiment of the present invention.

DETAILED DESCRIPTION OF THE PREFERRED EMBODIMENTS

Hereinafter, embodiments of the present invention will be described below with reference to the drawings.

[Configuration of Thin-Film Magnetic Head]

Figure 1:
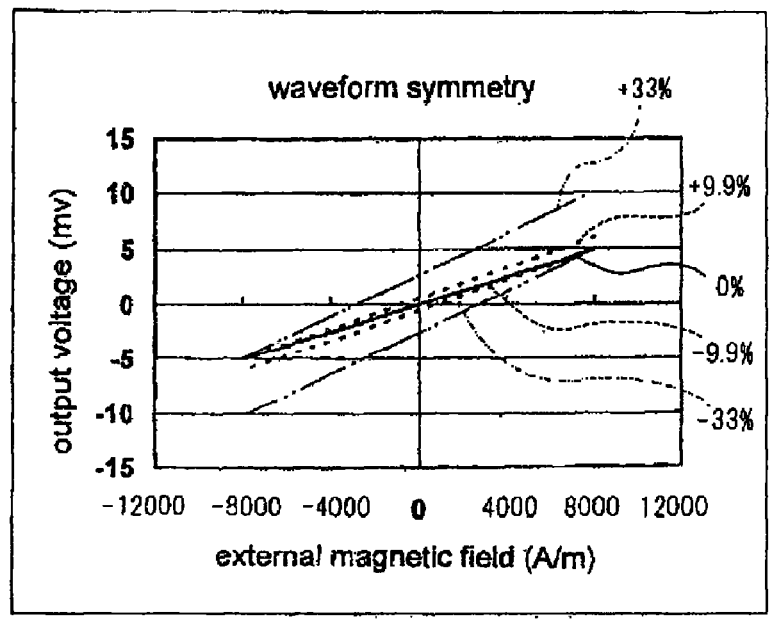
FIG. 1 is a graph showing the relationship between the external magnetic field and the output voltage, the graph being illustrative of waveform symmetry which is one of the characteristics of an MR element.
Figure 2:
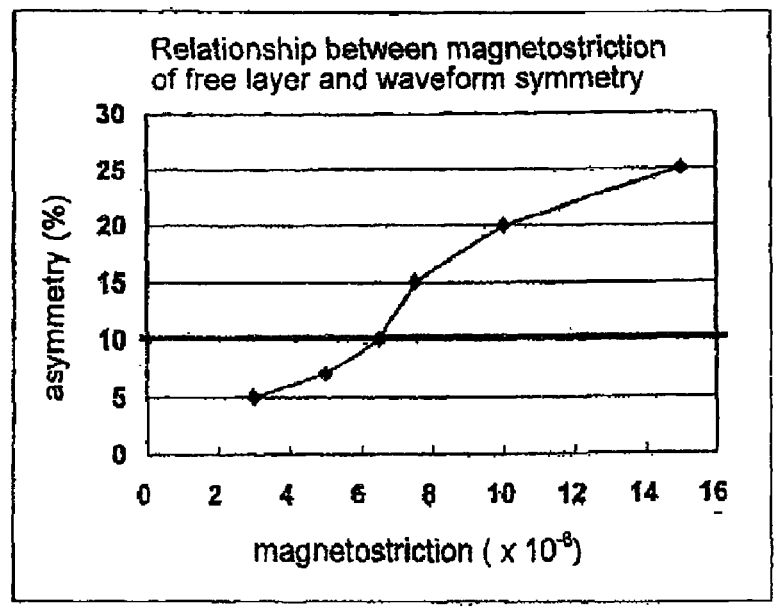
FIG. 2 is a graph showing the relationship between the magnetostriction of the free layer and the waveform symmetry of the MR element.
Figure 3:
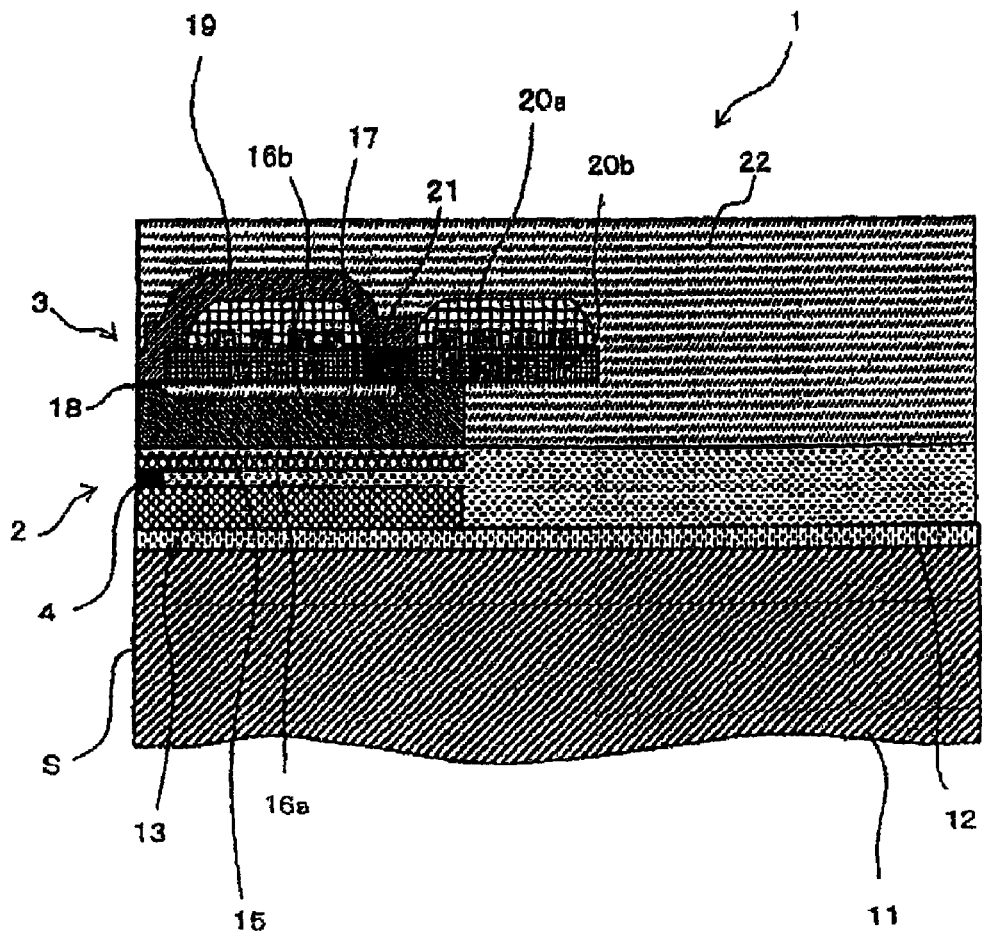
FIG. 3 is a cross-sectional view of a major portion of a thin-film magnetic head according to an embodiment of the present invention.

FIG. 3 conceptually shows a cross-sectional view of a major portion of a thin-film magnetic head having a magnetoresistance effect element according to the present invention.

Thin-film magnetic head 1 according to the present embodiment has substrate 11, reproducing unit 2 which reads data from a recording medium (not shown) and which is formed on substrate 11, and recording unit 3 for writing data on a recording medium (not shown) and which is formed on substrate 11.

Substrate 11 is made of $Al_2O_3$—TiC (AlTiC) that has excellent wear resistance. Base layer 12 made of alumina is disposed on an upper surface of substrate 11, and reproducing unit 2 and recording unit 3 are stacked on base layer 12.

Lower shield layer 13 made of a magnetic material such as Permalloy (NiFe), for example, is disposed on base layer 12. CPP-GMR element 4 which is a magneto-resistance effect element (hereinafter, simply referred to as "MR element") is disposed on lower shield layer 13 at an end thereof near surface S (FIG. 10) and has an end exposed on surface S to face a recording medium. First upper shield layer 15 made of a magnetic material such as Permalloy, for example, is disposed on MR element 4. Lower shield layer 13, MR element 4, and first upper shield layer 15 jointly make up reproducing unit 2. Insulating layer 16a is primarily disposed in a region between lower shield layer 13 and first upper shield layer 15 which is without MR element 4. MR element 4 is also referred to as an SV film (spin valve film).

Lower magnetic pole layer 17 made of a magnetic material such as Permalloy or CoNiFe is disposed on first upper shield layer 15 with insulating layer 16b interposed therebetween. Lower magnetic pole layer 17 functions as a lower magnetic pole layer of recording unit 3 and also as a second upper shield layer of MR element 4.

Upper magnetic pole layer 19 is disposed on lower magnetic pole layer 17 which functions as a second upper shield layer, with recording gap layer 18 interposed therebetween, which is made of a nonmagnetic material such as Ru or alumina. Recording gap layer 18 is disposed on lower magnetic pole layer 17 at an end thereof near surface S to face a recording medium and has an end exposed on surface S to face a recording medium. Upper magnetic pole layer 19 is made of a magnetic material such as Permalloy or CoNiFe. Lower magnetic pole layer (second upper shield layer) 17 and upper magnetic pole layer 19 are magnetically connected to each other by connector 21, and they make up a magnetic circuit as a whole.

Coils 20a, 20b made of an electrically conductive material such as copper are disposed as two layers between lower magnetic pole layer 17 and upper magnetic pole layer 19 and also between surface S to face a recording medium and connector 21. Each of coils 20a, 20b serves to supply magnetic fluxes to lower magnetic pole layer 17 and upper magnetic pole layer 19 and has a planar spiral shape surrounding connector 21. Coils 20a, 20b are insulated from the surrounding region by an insulating layer. Though coils 20a, 20b in the two layers are illustrated in this embodiment, they are not limited to the two layers, but may be in one layer or three or more layers.

Overcoat layer 22 is disposed in covering relation to upper magnetic pole layer 19, and protects the structure described above Overcoat layer 22 is made of an insulating material such as alumina, for example

[Configuration of MR Element]

Figure 4:
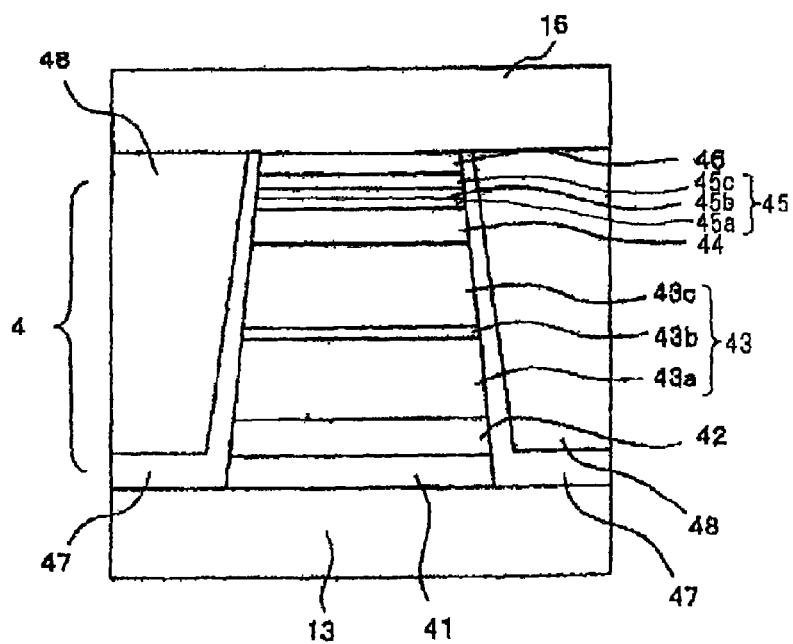
FIG. 4 is a view of an MR element shown in FIG. 3 as viewed from its surface to face a recording medium.

Next, MR element 4 (SV film) will be described in detail below with reference to FIG. 4, which is a view of MR element 4 as viewed from surface S to face a recording medium.

As described above, MR element 4 is interposed between lower shield layer 13 and upper shield layer 15. MR element 4 has a structure comprising buffer layer 41, antiferromagnetic layer 42, pinned layer 43, spacer layer 44, free layer 45, and cap layer 46 which are stacked successively in this order from the side of lower shield layer 13. In the embodiment shown in FIG. 4, Pinned layer 43 has a structure wherein nonmagnetic intermediate layer 43b is interposed between outer layer 43a and inner layer 43c each made of a ferromagnetic material. Pinned layer 43 having such a structure is referred to as a synthetic pinned layer. Outer layer 43a is held in contact with antiferromagnetic layer 42, and inner layer 43c is held in contact with spacer layer 44. Lower shield layer 13 and upper shield layer 15 serve as electrodes, respectively. A sense current flows in a direction orthogonal to the layer surface through lower shield layer 13 and upper shield layer 15 of MR element 4. Lower shield layer 13 and upper shield layer 15 comprise NiFe films having a thickness of about 2 μm or less.

One example of materials and thicknesses of the respective layers of MR element 4 is shown in Table 1.

TABLE 1

| | | material | thickness(nm) |
|---|---|---|---|
| | Cap layer | Ru | 10 |
| | Free layer | CoFe/Hf/CoMnGe | 1~2/0.2~1/4~6 |
| | spacer layer | Cu | 3 |
| pinned | inner layer | CoFe/Cu/CoFe/Cu/CoFe | 1/0.2/1.3/0.2/1.3 |
| layer | Nonmagnetic intermediate layer | Ru | 0.4 or 0.8 |
| | outer layer | CoFe | 5 |

TABLE 1-continued

| | material | thickness(nm) |
|---|---|---|
| Antiferromagnetic layer | IrMn | 7 |
| Buffer layer | Ta/NiCr | 1/5 |

A combination of materials in which exchange coupling between anti-ferromagnetic layer 42 and outer layer 43a of pinned layer 43 becomes favorable is selected as a material of buffer layer 41. Buffer layer 41 comprises a laminated layer of Ta having a thickness of 1 nm and NiCr having a thickness of 5 nm. Incidentally, in the present specification, "/" showing a multi-layer structure means that the layer of the left side of "/" is a layer lower than the layer of the right side, that is, a layer formed earlier.

Anti-ferromagnetic layer 42 plays a role of fixing the magnetization direction of pinned layer 43, and for example, comprises a film such as IrMn film that has a thickness of 7.0 nm.

Pinned layer 43 is formed as a magnetic layer, and, as described above, has a structure wherein outer layer 43a, nonmagnetic intermediate layer 43b, and inner layer 43c are stacked in the order named. Outer layer 43a has its magnetization direction fixed with respect to an external magnetic field by antiferromagnetic layer 42. Outer layer 43a comprises a 70CoFe film having a thickness of 5 nm, for example. Nonmagnetic intermediate layer 43b comprises an Ru film having a thickness of 0.4 nm or 0.8 nm, for example. Inner layer 43c is a ferromagnetic layer which, though not described in detail, has a five-layer structure comprising, for example, a 90CoFe film having a thickness of 1.0 nm, a Cu film having a thickness of 0.2 nm, a 39CoFe film having a thickness of 1-3 nm, a Cu film having a thickness of 0.2 nm, and a 30CoFe film having a thickness of 1.3 nm. In such a synthetic pinned layer, magnetic moments of outer layer 43a and inner layer 43c cancel each other to suppress an overall leaking magnetic field, and inner layer 43c has its magnetization direction fixed firmly.

Spacer layer 44 comprises a Cu film having a thickness of 3.0 nm, for example.

Free layer 45 has its magnetization direction variable depending on the external magnetic field. In the present embodiment, free layer 45 has a three-layer structure comprising 70CoFe film 45a, which is a magnetic layer, having a thickness ranging from 1.0 nm to 2.0 nm, Hf film 45b, which is a magnetostriction reduction layer, having a thickness ranging from 0.2 nm to 1.0 nm, and Co50Mn26Ge24 film 45c, which is a Heusler alloy layer, having a thickness ranging from 4.0 nm to 6.0 nm.

Cap layer 46 is provided to prevent deterioration of MR element 4, and is made of Ru having a thickness of 10.0 nm, for example.

Hard bias films 48 are disposed on opposite sides (right and left sides in FIG. 4) of MR element 4 in a track width direction (an in-plane direction of each of the layers of MR element 4 within a plane parallel to surface S to face a recording medium (see FIG. 3)), with insulating films 47 interposed therebetween. Hard bias films 48 apply a biasing magnetic field in the track width direction to free layer 45 to turn free layer 45 into a single magnetic domain. Hard bias films 48 are made of a hard magnetic material such as CoPt, CoCrPt, or the like, for example. Insulating films 47 serve to prevent the sensing current from leaking into hard bias films 48, and may be in the form of an oxide film of $Al_2O_3$, for example. Insulating films 47 may be a part of insulating layer 16a.

[Configuration and Operation Effect of Free layer]

Free layer 45, which represents the most characteristic structure of the present embodiment, will be described below As described in Japanese Patent Laid-Open No. 2003-218428 and Japanese Patent Laid-Open No. 2006-5282, it has been known that MR element 4 should preferably have Heusler alloy layers as free layer 45 and pinned layer 43 in view of the characteristics such as the MR ratio, etc. It has been considered that it is preferable to use CoMnGe among the Heusler alloys in order to reduce the annealing temperature to 290° C. or lower to prevent the magnetic permeability of shield layers 13, 15, 17 from being lowered and to achieve a high spin polarizability for a higher MR ratio. Heretofore, however, the large magnetostriction of CoMnGe in its regularized state has been problematic, and it has been practically difficult to employ a CoMnGe film in the free layer.

Figure 5:
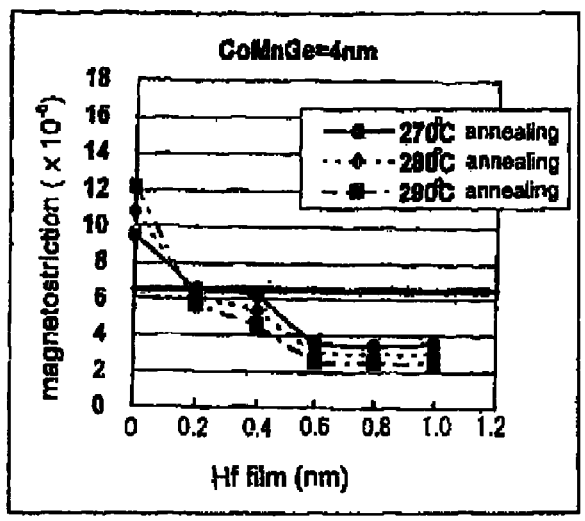
FIG. 5 is a graph showing the relationship between the thickness of a magnetostriction reduction layer and the magnetostriction of a free layer of the MR element shown in FIG. 3.
Figure 6:
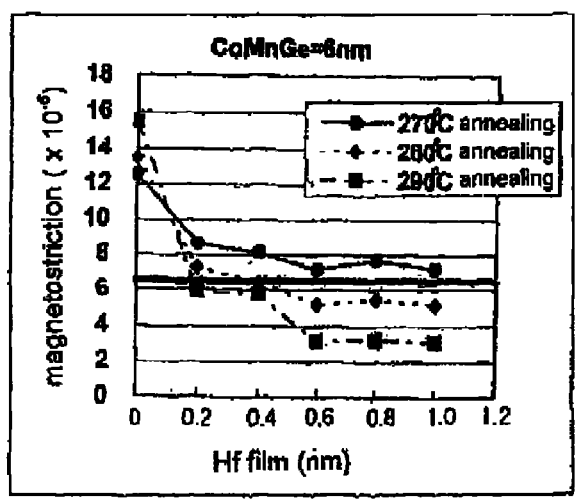
FIG. 6 is a graph showing the relationship between the thickness of the magnetostriction reduction layer and the magnetostriction of the free layer of the MR element shown in FIG. 3.

The inventor of the present application has made a study to find a process for reducing the magnetostriction of the free layer containing CoMnGe, and has found that layers of elements in the 4th through 6th groups may be formed in contact with CoMnGe. As shown in Table 1, the magnetostriction of free layer 45 having a three-layer structure including 70CoFe film (magnetic layer) 45a, Hf film (magnetostriction reduction layer) 45b, and Co50Mn26Ge24 film (Heusler alloy layer) 45c was determined, and the results are shown in Tables 2, 3 and FIGS. 5, 6. Specifically, Table 2 and FIG. 5 show the magnetostriction of free layer 45 when the thickness of Co50Mn26Ge24 film 45c was 4.0 nm and the thickness of Hf film 45b was varied, and Table 3 and FIG. 6 show the magnetostriction of free layer 45 when the thickness of Co50Mn26Ge24 film 45c was 6.0 nm and the thickness of Hf film 45b was varied. These Tables and Figs show the values obtained when the annealing temperature was 270° C., 280° C., and 290° C.

TABLE 2

Co50Mn26Ge24 film: 4.0 nm

| | Hf film (nm) | Annealed: 270° C. | Annealed: 280° C. | Annealed: 290° C. |
|---|---|---|---|---|
| | | Magnetostriction (×10$^{-6}$) | | |
| Comparative example | 0 | 9.52 | 10.75 | 12.14 |
| Inventive embodiment | 0.2 | 6.58 | 6.14 | 5.70 |
| | 0.4 | 6.17 | 5.37 | 4.56 |
| | 0.6 | 3.55 | 3.04 | 2.52 |
| | 0.8 | 3.40 | 2.95 | 2.50 |
| | 1.0 | 3.52 | 3.00 | 2.48 |

TABLE 3

Co50Mn26Ge24 film: 6.0 nm

| | Hf film (nm) | Annealed: 270° C. | Annealed: 280° C. | Annealed: 290° C. |
|---|---|---|---|---|
| | | Magnetostriction (×10$^{-6}$) | | |
| Comparative example | 0 | 12.53 | 13.43 | 15.45 |
| Inventive embodiment | 0.2 | 8.66 | 7.28 | 5.91 |
| | 0.4 | 8.12 | 6.42 | 5.71 |
| | 0.6 | 7.17 | 5.16 | 3.15 |
| | 0.8 | 7.71 | 5.46 | 3.21 |
| | 1.0 | 7.20 | 5.16 | 3.11 |

It can be seen from Tables 2, 3 and FIGS. 5, 6 that if Co50Mn26Ge24 film 45c has a thickness of 4.0 nm or 6.0 nm, then all the structures having Hf film 45b (Inventive embodiments: the structures in which the thickness of the Hf film was greater than 0 nm) have smaller magnetostriction than the structures having no Hf film 45b (comparative examples: the structures in which the thickness of the Hf film was 0 nm).

In particular, if Co50Mn26Ge24 film 45c had a thickness of 4.0 nm, then though the magnetostriction was slightly out of the allowable range when the annealing temperature was 270° C. and the thickness of Hf film 45b was 0.2 nm, the magnetostriction was sufficiently small for all other Inventive embodiments. If Co50Mn26Ge24 film 45c had a thickness of 6.0 nm, then the annealing temperature of 270° C. caused a large level of magnetostriction and was not preferable. However, with the annealing temperature of 280° C. or 290° C., though the magnetostriction was slightly out of the allowable range when the thickness of Hf film 45b was 0.2 nm and the annealing temperature was 280° C., the magnetostriction was sufficiently small for all other Inventive embodiments.

Figure 7:
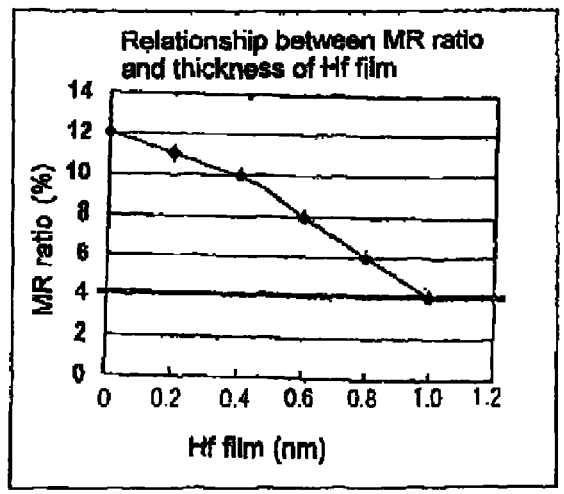
FIG. 7 is a graph showing the relationship between the thickness of the magnetostriction reduction layer and the MR ratio of the MR element shown in FIG. 3.

FIG. 7 shows the relationship between the thickness of Hf film 45b and the MR ratio of MR element 4 when Co50Mn26Ge24 film 45c has a thickness of 4.0 nm and the annealing temperature is 290° C. According to the illustrated relationship, if the thickness of HF film 45b is in a range up to 1.0 nm, a high MR ratio is equivalent to or higher than the MR ratio of 4% of conventional general MR elements.

It will be understood from the above results that if Hf film 45b is in a range from 0.2 nm to 1.0 nm, then the magnetostriction of free layer 45 is reduced and the MR ratio is increased. The reason for the reduced magnetostriction of free layer 45, which is achieved by providing Hf film 45b in the interface between CoFe film 45a and CoMnGe film 45c, is considered to be due to the amorphousization of a magnetic material by Hf. The amorphousization of the Heusler alloy by Hf can reduce the magnetostriction of the interface between CoFe film 45a and CoMnGe film 45c, with the result that the magnetostriction of free layer 45 in its entirety is reduced. From this standpoint, it can be thought that substantially the same advantages can be obtained by using a Zr film, a Ti film, a Ta film, a W film, or the like, instead of the Hf film, as the magnetostriction reduction layer. In other words, it may be effective to provide a layer of a 4th group element, a 5th group element, or a 6th group element which is liable to amorphousize a magnetic material.

The composition of CoMnGe film 45c as a Heusler alloy layer should preferably be of an L21 structure having a composition ratio of 2:1:1, but may be of a B2 structure which is an irregular structure. The B2 structure comprises 50 at % of Co and remaining 50 at % of Mn and Ge, with Mn and Ge being not limited to any particular ratio. The thickness of CoMnGe film 45c should preferably be in the range from 4 nm to 6 nm. If the thickness of CoMnGe film 45c is smaller than 4 nm, then CoMnGe film 45c is less likely to be ordered structure, and hence a thickness of CoMnGe film 45c that is smaller than 4 nm is not preferable. If the thickness of CoMnGe film 45c is greater than 6 nm, the read gap of whole MR element 4 including CoMnGe film 45c becomes too large, obstructing efforts to provide a higher density structure, and hence a thickness of CoMnGe film 45c that is greater than 6 nm is not preferable.

CoFe film 45a which is a magnetic layer is disposed between CoMnGe film 45c and spacer layer 44 because it is difficult to form CoMnGe film 45c directly on Cu of spacer layer 44. The proportion of Co in CoFe film 45a should preferably be in the range from 50 at % to 70 at % in order for CoMnGe film 45c to have a body-centered cubic lattice structure (bcc structure) like the Heusler alloy for reduced retentive power.

The applicant conducted a basic experiment to find an optimum thickness for 70CoFe film 45a. In the basic experiment, free layer 45 had a two-layer structure (exclusive of an Hf film) comprising a 70CoFe film and a CoMnGe film. The thickness of the CoMnGe film was held to 4 nm, and a change in the MR ratio was determined when the thickness of the 70CoFe film was varied. The significant of the basic experiment will be described below.

The most general conventional MR element, wherein a Cu film was used as spacer layer 44 and a single CoFe layer as free layer 45, has an MR ratio of about 4%. As disclosed in Japanese Patent Laid-Open No. 2003-218428, it is known that the MR ratio can be increased by using a Heusler alloy layer having a high spin polarizability, e.g., a CoMnGe film, as free layer 45. It has been found, however, that if free layer 45 comprises a single CoMnGe film, then a high MR ratio cannot be obtained because Cu of spacer layer 44 and CoMnGe of free layer 45 are mixed with each other. It has been proposed to employ free layer 45 of a multilayer structure and to insert a CoFe film between the Cu film of spacer layer 44 and the CoMnGe film of free layer 45 for thereby preventing Cu and CoMnGe from being mixed with each other to prevent the MR ratio from being lowered. The basic experiment was conducted to determine the relationship between the thickness of a 70CoFe film and the MR ratio of an MR element wherein free layer 45 has a two-layer structure made up of a 70CoFe film and a CoMnGe film. The results of the basic experiment are shown in FIG. 8.

Figure 8:
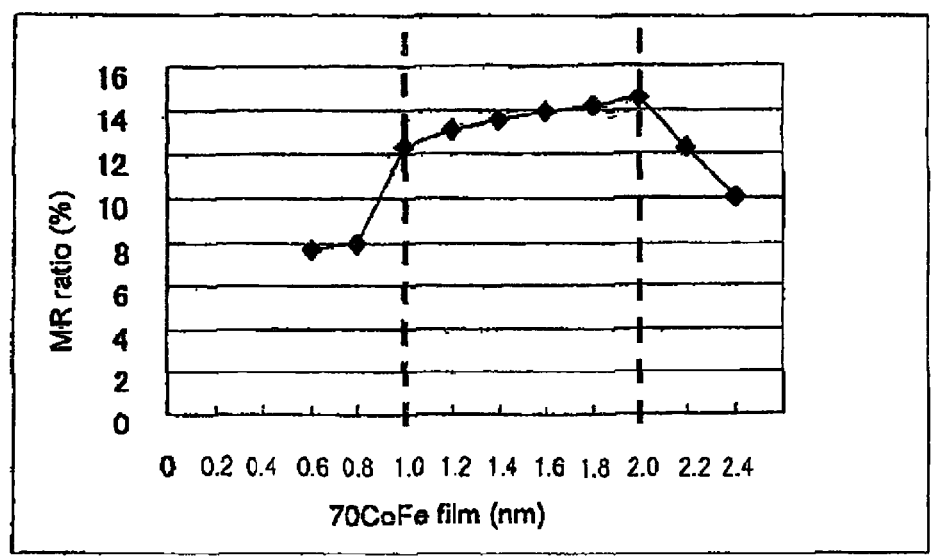
FIG. 8 is a graph showing the relationship between the thickness of a magnetic layer of a free layer without a magnetostriction reduction layer and the MR ratio.

FIG. 8 indicates that the MR ratio increases if the thickness of the 70CoFe film is 1 nm or greater. This is thought to show that if the thickness of the 70CoFe film is too small, then the 70CoFe film fails to perform effective magnetization as a magnetic body on the Cu film of spacer layer 44. Therefore, the thickness of the 70CoFe film should preferably be 1 nm or greater.

If the thickness of the 70CoFe film increases, then since the bcc structure thereof becomes more stable, thus promoting film growth of CoMnGe for a higher MR ratio. However, if the thickness of the 70CoFe film exceeds 2 nm, then the MR ratio is lowered. The reasons for this will be described below. If the 70CoFe film becomes too thick, then the clearance between the Cu film and the CoMnGe film becomes too large, thus separating electrons positioned in the vicinity of spacer layer 44 from the CoMnGe film of a high-spin-polarizability material. As a result, free layer 45 is virtually regarded as a single layer of 70CoFe. Stated otherwise, the effect produced by providing the CoMnGe film of a high-spin-polarizabilty material in free layer 45 becomes poor. Accordingly, the thickness of the 70CoFe film should preferably be 2 nm or smaller. A review of FIG. 8 indicates that if the thickness of the 70CoFe film is 2.2 nm, then an MR ratio of about 12%, which is equivalent to the MR ratio achieved if the thickness of the 70CoFe film is 1 nm, is achieved. In this case, though the MR ratio is sufficiently large, the magnetostriction of the 70CoFe film is not negligible. Specifically, if the thickness of the 70CoFe film is greater than 2 nm, the magnetostriction of the 70CoFe film increases to about $5 \times 10^{-5}$. In this case, even if an Hf film is inserted, the magnetostriction of free layer 45 cannot be sufficiently reduced. Consequently, the thickness of the 70CoFe film in free layer 45 should preferably be in the range from 1 nm to 2 nm.

The basic experiment described above made it possible to determine the preferred thickness of the 70CoFe film in free layer 45. A structure, wherein free layer 45 has a two-layer structure comprising a CoFe film and a CoMnGe film like the MR elements employed in the basic experiment, has a high MR ratio, but is problematic in that the magnetostriction of the CoMnGe film is large and good waveform symmetry cannot be obtained. According to the embodiment of the present invention described above, free layer 45 has a structure composed of at least three layers including CoFe film 45a, Hf film 45b, and CoMnGe film 45c. This arrangement can maintain a relatively high MR ratio as shown in FIG. 7 and reduce the magnetostriction of free layer 45 as shown in FIGS. 5 and 6. The structure wherein the thickness of Hf film 45b is 0 nm in FIG. 7 is of essentially the same state as the structure wherein the thickness of the 70CoFe film is 1 nm in FIG. 8, thus providing an MR ratio of about 12%.

According to the present Invention, as shown in FIG. 7, though the MR ratio is made lower than the structures used in the basic experiment whose results are shown in FIG. 8, by inserting Hf film 45b, if the thickness of Hf film 45b is in a range up to 1 nm, then an MR ratio (4% or greater) that is equal to or greater than the MR ratio of the most general conventional MR element wherein a Cu film is used as spacer layer 44 and a single CoFe layer as free layer 45 is obtained. In other words, CoMnGe film 45c is effective to a certain extent. Furthermore, as shown in FIGS. 5 and 6, the magnetostriction of free layer 45 can be reduced.

As described in detail above, a higher MR ratio than heretofore can be achieved by providing free layer 45 having a structure of at least three layers including CoFe film 45a, Hf film 45b, and CoMnGe film 45c, arranging the thickness of CoFe film 45a in the range from 1 nm to 2 nm, and arranging the thickness of Hf film 45b in the range from 0.2 nm to 1.0 nm. In addition, the magnetostriction of CoFe film 45a and the magnetostriction of CoMnGe film 45c are reduced, thereby reducing the overall magnetostriction of free layer 45 to a small level.

[Head Gimbal Assembly and Hard-Disk Drive which Include Thin-Film Magnetic Head]

Figure 9:
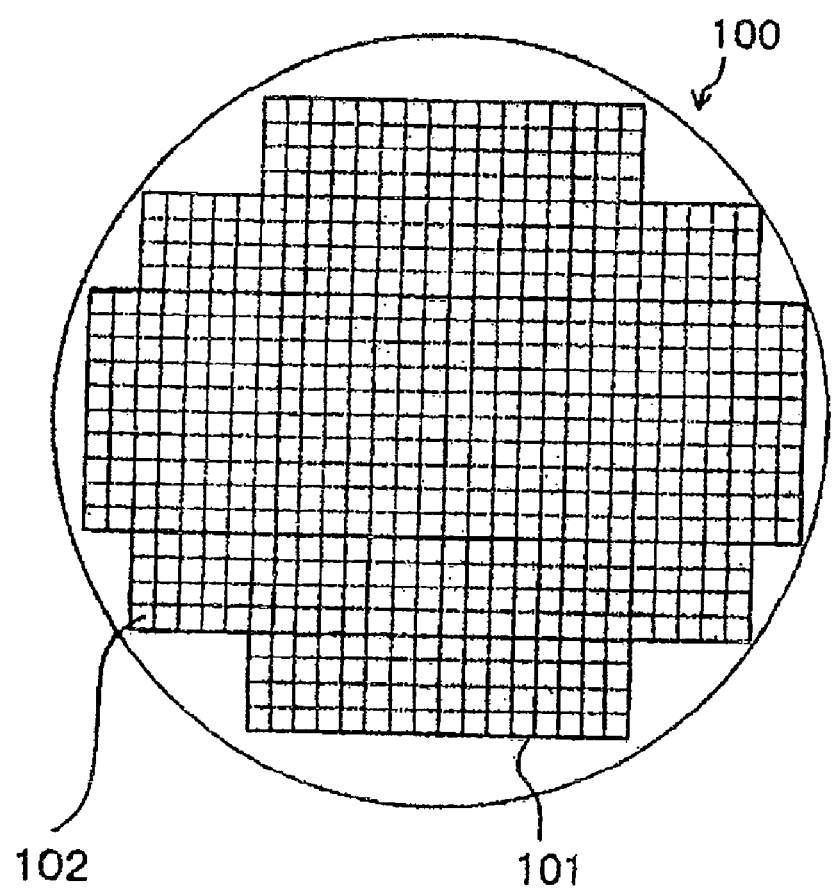
FIG. 9 is a plan view of one example of a wafer in which thin-film magnetic heads shown in FIG. 3 are formed.

Many thin-film magnetic heads 1 according to the present invention are formed in a single wafer. FIG. 9 shows a diagrammatic plan view of the wafer having many structures (substrates) that includes the thin-film magnetic head shown in FIG. 3 thereon.

Wafer 100 is divided into a plurality of head element aggregates 101 each including a plurality of head elements 102 each serving as a working unit for polishing surface S to face a recording medium of thin-film magnetic head 1 (see FIG. 3). Dicing portions (not shown) are provided between head element aggregates 101 and also provided between head elements 102. Head element 102 is a structure (substrate) including the structure of thin-film magnetic head 1, and becomes thin-film magnetic head 1 after having been subjected to necessary processing such as polishing to form surface S to face a recording medium. The polishing process is carried out generally on a plurality of head elements 102 which has been cut out into a row.

Figure 10:
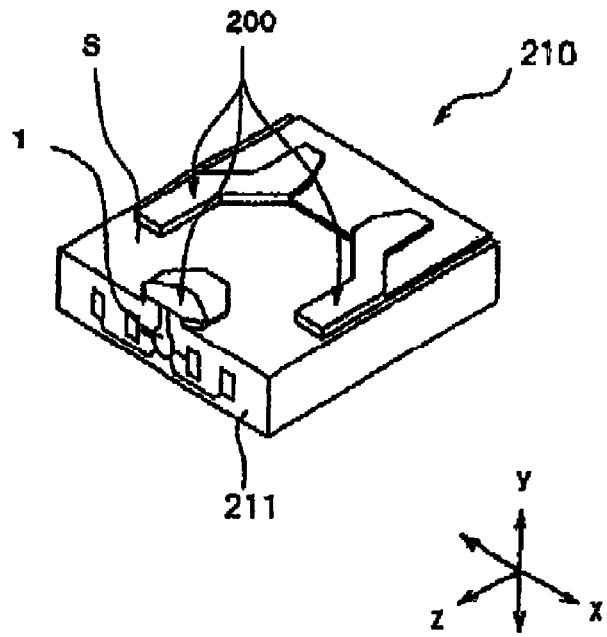
FIG. 10 is a perspective view of one example of a slider including the thin-film magnetic head shown in FIG. 3.

A head gimbal assembly and a hard disk drive having the thin-film magnetic head according to the present invention will be described below. First, slider 210 included in the head gimbal assembly will be described below with reference to FIG. 10. In the hard disk drive, slider 210 is arranged opposite to a hard disk, which is a rotationally-driven disc-shaped recording medium. Slider 210 has thin-film magnetic head 1 obtained from head element 102 (see FIG. 9). Slider 210 has a substantially hexahedral shape in which surface S to face a recording medium is formed into an air bearing surface 200 which is positioned opposite to the hard disk. When the hard disk rotates in z direction in FIG. 10, an air stream passing between the hard disk and slider 210 applies a lifting force to slider 210 downward in a y direction. Slider 210 is lifted from the surface of the hard disk by the lifting force. X directions in FIG. 10 represent a direction transverse to the tracks of the hard disk. At end surface 211 on the outlet side of the airflow of slider 210, are electrode pads to input or output signals to/from reproducing unit 2 and recording unit 3 (see FIG. 3). Surface 211 is the upper end face in FIG. 3.

Head gimbal assembly 220 will be described below with reference to FIG. 11. Head gimbal assembly 220 has slider 210 and suspension 221 by which slider 210 is resiliently supported. Suspension 221 comprises load beam 222 in the form of a leaf spring made of stainless steel, for example, flexure 223 mounted on an end of load beam 222 for giving slider 210 an appropriate degree of freedom, slider 210 being joined to flexure 223, and base plate 224 mounted on the other end of load beam 222. Base plate 224 is mounted on arm 230 of an actuator for moving slider 210 in x directions transverse to the tracks of hard disk 262 The actuator has arm 230 and a voice-oil motor for moving arm 230. A gimbal for keeping slider 210 at a constant attitude is mounted on a portion of flexure 223 where slider 210 is installed.

Head gimbal assembly 220 is mounted on arm 230 of the actuator. A structure wherein head gimbal assembly 220 is mounted on single arm 230 is referred to as a head arm assembly. A structure wherein a carriage has a plurality of arms and head gimbal assembly 220 is mounted on each of the arms is referred to as a head stack assembly.

Figure 11:
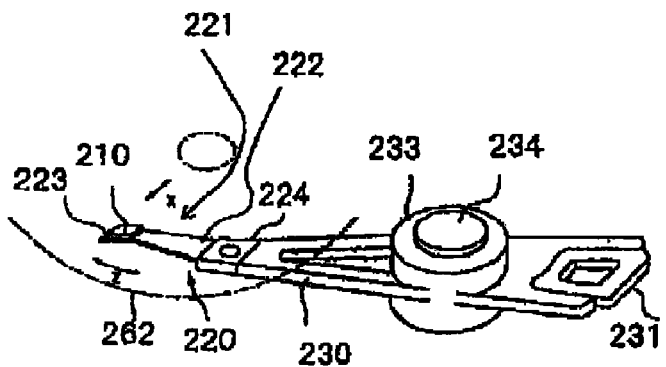
FIG. 11 is a perspective view of a head gimbal assembly including the slider shown in FIG. 10.

FIG. 11 shows a head arm assembly by way of example. In the head arm assembly, head gimbal assembly 220 is mounted on an end of arm 230. Coil 231 which is part of the voicecoil motor is mounted on the other end of arm 230. In the intermediate portion of arm 230, bearing 233 which is attached to shaft 234 for rotatably supporting arm 230 is provided.

Figure 12:
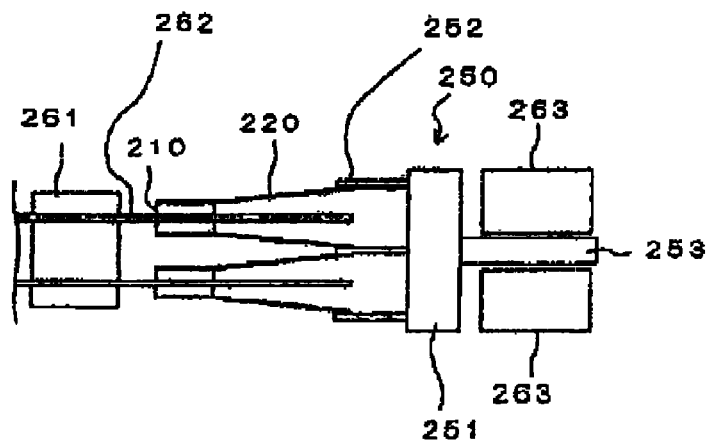
FIG. 12 is a side elevational view of a major portion of a hard disk drive including the head gimbal assembly shown in FIG. 11.
Figure 13:
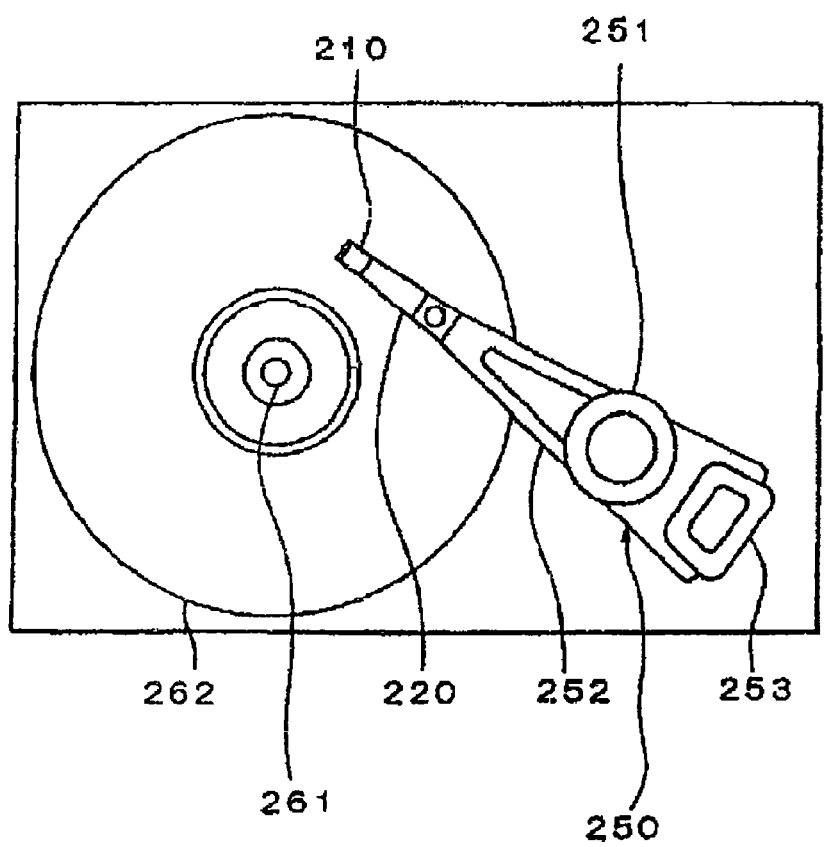
FIG. 13 is a plan view of the hard disk drive including the head gimbal assembly shown in FIG. 11.

A head stack assembly and a hard disk drive will be described below with reference to FIGS. 12 and 13. FIG. 12 is a view showing a major portion of a hard disk drive, and FIG. 13 is a plan view of the hard disk drive. Head stack assembly 250 has carriage 251 having a plurality of arms 252. A plurality of head gimbal assemblies 220 are attached to a plurality of arms 252 such that head gimbal assemblies 220 are arranged apart from each other in the vertical direction. Coil 253, which constitutes a part of the voice-coil motor, is attached to carriage 251 on the side opposite to arms 252. Head stack assembly 250 is installed in a hard disk drive. The hard disk drive has a plurality of hard disks (magnetic recording media) 262 mounted on spindle motor 261. Two sliders 210 are arranged at positions opposite to each other interposing hard disk 262 therebetween. The voice coil motor has permanent magnets 263 which are arranged in positions opposite to each other interposing coil 253 of head stack assembly 250 therebetween.

Head stack assembly 250, except sliders 210, and the actuator support sliders 210 and position sliders 210 with respect to hard disks 262.

In the hard disk drive, the actuator moves sliders 210 in directions transverse to the tracks of hard disks 262 and position sliders 210 with respect to hard disks 262. Thin-film magnetic heads 1 included in sliders 210 record information in hard disks 262 through recording unit 3, and reproduce information recorded in hard disks 262 through reproducing unit 2.

Thin-film magnetic head 1 is not limited to the above embodiments but may be modified in various ways. For example, though thin-film magnetic head 1 that has a structure wherein reading MR element 4 is disposed near substrate 11 and writing induction-type electromagnetic transducer is stacked on MR element 4 has been described in the above embodiments, reading MR element 4 and the writing induction-type electromagnetic transducer may be switched around. Though a thin-film magnetic head having both an MR element and an induction-type electromagnetic transducer has been described in the above embodiments, a thin-film magnetic head may have only an MR element.

Although a certain preferred embodiment of the present invention has been shown and described in detail, it should be understood that various changes and modifications may be made without departing from the spirit or scope of the appended claims.

What is claimed is:

1. A magnetoresistance effect element comprising:
a pinned layer having a fixed magnetization direction;
a free layer having a magnetization direction variable depending on an external magnetic field; and
a nonmagnetic spacer layer disposed between said pinned layer and said free layer,
said free layer including a magnetic layer comprising a CoFe film, a magnetostriction reduction layer comprising an Hf film which is a film of a $4^{th}$ group element, and Heusler alloy layer comprising a CoMnGe film, said magnetic layer, said magnetostriction reduction layer, and said Heusler alloy layer are stacked on said nonmagnetic spacer layer in this order, so that said Hf film of said magnetostriction reduction layer reduces magnetostriction of an interface between said CoFe film of said magnetic layer and said CoMnGe film of said Heusler alloy layer, and said CoMnGe film of said Heusler alloy layer, and said CoMnGe film of said Heusler alloy layer exhibits a high spin polarizability after low-temperature anneal.

2. A magnetoresistance effect element according to claim 1, wherein said magnetostriction reduction layer has a thickness ranging from 0.2 nm to 1.0 nm.

3. A magnetoresistance effect element according to claim 1, wherein said magnetoresistance effect element is annealed at a temperature of 300° C. or lower.

4. A thin-film magnetic head having a magnetoresistance effect element according to claim 1.

5. A magnetoresistance effect element according to claim 1, wherein a composition of the CoMnGe film is an L21 structure having a composition ratio of 2:1:1 or a B2 structure comprising 50 at% of Co and remaining 50 at% of Mn and Ge.

6. A magnetoresistance effect element according to claim 1, wherein a thickness of the CoMnGe film is in a range from 4 nm to 6 nm.

7. A magnetoresistance effect element according to claim 1, wherein the CoFe film is disposed between the Heusler alloy layer and the spacer layer.

8. A magnetoresistance effect element according to claim 1, wherein a proportion of Co in the CoFe is in a range from 50 at% to 70 at%.

9. A magnetoresistance effect element according to claim 1, wherein a thickness of the CoFe film is in a range from 1 nm to 2 nm.

* * * * *